United States Patent
Norouzpourshirazi et al.

(10) Patent No.: US 12,512,827 B2
(45) Date of Patent: Dec. 30, 2025

(54) BEYOND-THE-RAILS BOOTSTRAPPED SAMPLING SWITCH

(71) Applicant: Cirrus Logic International Semiconductor Ltd., Edinburgh (GB)

(72) Inventors: Arashk Norouzpourshirazi, Austin, TX (US); Ravi K. Kummaraguntla, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 670 days.

(21) Appl. No.: 17/881,845

(22) Filed: Aug. 5, 2022

(65) Prior Publication Data

US 2024/0048108 A1    Feb. 8, 2024

(51) Int. Cl.
*H03K 17/06*      (2006.01)
*H03K 19/017*     (2006.01)

(52) U.S. Cl.
CPC ..... *H03K 17/063* (2013.01); *H03K 19/01735* (2013.01)

(58) Field of Classification Search
None
See application file for complete search history.

(56) References Cited

U.S. PATENT DOCUMENTS

| | | | |
|---|---|---|---|
| 8,502,594 B2 * | 8/2013 | Steensgaard-Madsen | H03K 17/063 327/434 |
| 8,525,574 B1 * | 9/2013 | Duggal | G11C 27/02 327/390 |
| 9,484,905 B1 * | 11/2016 | Mai | H03K 17/08122 |
| 10,187,940 B2 | 1/2019 | Polley | |
| 10,277,244 B1 | 4/2019 | Srivastava | |
| 10,742,227 B1 | 8/2020 | Schifmann | |
| 2006/0202735 A1 | 9/2006 | Askin et al. | |

(Continued)

FOREIGN PATENT DOCUMENTS

EP      3203480 A1    8/2017
WO   2018071479 A1   4/2018

OTHER PUBLICATIONS

Combined Search and Examination Report under Sections 17 and 18(3), UKIPO, Application No. GB2302512.5, mailed Aug. 21, 2023.

(Continued)

*Primary Examiner* — Thomas J. Hiltunen
(74) *Attorney, Agent, or Firm* — Jackson Walker L.L.P.

(57) ABSTRACT

A bootstrapped switch circuit may include a signal switch configured to, when enabled via a gate terminal of the signal switch during a sampling phase of the bootstrapped switch circuit, pass an input signal received at its input to its output. The bootstrapped switch circuit may also include a bootstrap circuit coupled to the signal switch comprising a bootstrap capacitor and a plurality of switches coupled to the bootstrap capacitor, wherein one of the plurality of switches comprises a p-type field effect transistor configured to decouple, by deactivating a second p-type field effect transistor, the bootstrap capacitor during a bootstrap phase of the bootstrapped switch circuit in which the signal switch is disabled, and further wherein the p-type field effect transistor is coupled to other of the plurality of switches and the bootstrap capacitor such that the signal switch is able to pass the input signal having a magnitude greater than voltage supply rails of the bootstrapped switch circuit from the input to the output.

12 Claims, 3 Drawing Sheets

(56) References Cited

U.S. PATENT DOCUMENTS

2012/0268304 A1   10/2012  Lin
2015/0097596 A1    4/2015  Rysinski
2024/0053387 A1*  2/2024  Norouzpourshirazi ...................... G01R 19/2506

OTHER PUBLICATIONS

Examination Report under Section 18(3), UKIPO, Application No. GB2302512.5, dated May 31, 2024.

\* cited by examiner

BEYOND-THE-RAILS BOOTSTRAPPED SAMPLING SWITCH

FIELD OF DISCLOSURE

The present disclosure relates in general to methods and systems for implementing a bootstrapped sampling switch configured to sample input signals higher in magnitude than available supply rails.

BACKGROUND

Delta-sigma modulators are typically used in electronic circuits such as analog-to-digital converters (ADCs). Often, such ADCs employ an antialiasing filter to filter an analog input signal that may be sampled by a sampling network at the input of the delta-sigma modulator for conversion into an equivalent digital signal by the ADC. An example of such a sampling network is a switched capacitor circuit.

As in many applications, it may be desirable to minimize power consumption in ADCs and other circuits, especially as ADCs may be used in battery-operated devices such as smartphones and tablets. Low voltage operation in switched capacitor circuits may be achieved by using a special low-voltage bootstrapped switch. FIG. 1 illustrates an example circuit diagram of a bootstrapped switch circuit 1, as is known in the art. Bootstrapped switch circuit 1 may include a signal switch MNSW embodied by an n-type transistor and a bootstrap circuit comprising switches S1, S2, S3, S4, S5, and a bootstrap capacitor 2 having a capacitance $C_{offset}$. During a bootstrap phase ϕ2, charging switches S3 and S4 may charge bootstrap capacitor 2 to a rail voltage $V_{DD}$ while switch S5 couples a gate terminal voltage of the signal switch to rail voltage $V_{SS}$ (e.g., ground voltage). During a sampling phase ϕ$_1$, switches S1 and S2 may couple precharged bootstrap capacitor 2 between a gate terminal and a source terminal of signal switch MNSW such that its gate-source voltage $V_{GS}$ is equal to a voltage $V_C$ ($V_C ≈ V_{DD}$) across bootstrap capacitor 2. Such switch configuration may allow rail-to-signal switching because gate-source voltage $V_{GS}$ may remain constant during sampling phase ϕ$_1$ independently of an input signal $v_{in}$ to be passed through signal switch MNSW to a drain terminal of signal switch MNSW.

FIG. 2 illustrates an example transistor-level implementation of bootstrapped switch circuit 1, as is known in the art. Transistors MN1, MP2, MN3, MP4, and MN5 depicted in FIG. 2 may implement ideal switches S1, S2, S3, S4, and S5 of FIG. 1, respectively. Transistors MN1, MN3 and MN5 may comprise n-type transistors while transistors MP2 and MP4 may comprise p-type transistors. Additional transistors and connectivity modified from that shown in FIG. 1 may extend all switch operation from rail-to-rail while limiting all relevant gate-source voltages of transistors to rail voltage $V_{DD}$. Gate terminal connections of each of transistor MP2 and transistor MP4 may prevent their overstress as a voltage on node B (e.g., at one terminal of bootstrap capacitor 2) rises above rail voltage $V_{DD}$. N-type transistor MN6S may trigger transistor MP2 on at the beginning of sampling phase ϕ$_1$ while n-type transistor MN6 may keep transistor MP2 on while the voltage on node A (e.g., at another terminal of bootstrap capacitor 2) rises to input voltage $v_{in}$. Gate terminals of transistors MN1 and MN6 may be coupled to the gate terminal of signal switch MNSW, thus allowing transistors MN1 and MN6 to be turned on similar to that of signal switch MNSW. Further, n-type transistor MNT5 may prevent a gate-drain voltage of transistor MN5 from exceeding rail voltage $V_{DD}$ while transistor MN5 is turned off during sampling phase ϕ$_1$. During sampling phase ϕ$_1$ when transistor MNT5 is turned off, its drain-bulk diode junction voltage may reach a reverse bias of $2V_{DD}$. Further, the bulk of transistors MP2 and MP4 are coupled to the node of highest potential in bootstrapped switch circuit 1, i.e., node B, and not coupled to rail voltage $V_{DD}$.

P-type transistor MP6 may be configured to decouple bootstrap capacitor 2 during a bootstrap phase φ2, by biasing the gate terminal of p-type transistor MP2 to rail voltage $V_{DD}$ while the source terminal of p-type transistor MP2 is also biased to the same rail voltage $V_{DD}$ by p-type transistor MP4. P-type transistor MP6, with its bulk coupled to rail voltage $V_{DD}$, may be turned off by phase signal φ$_{2p}$ when the bootstrap phase ends.

For proper operation, the voltage at the drain side of signal switch MNSW must always be higher than that at the source side at the moment of switching in order to prevent the drain-gate voltage of signal switch MNSW from exceeding rail voltage $V_{DD}$ during the turn-on transient of signal switch MNSW. In order to ensure this condition, as additional transistor MN2 may be coupled between node A and the drain terminal of signal switch MNSW, with the gate terminal of transistor MN2 coupled to the gate terminal of signal switch MNSW, such that signal switch MNSW becomes completely symmetrical. The gate terminal voltage of signal switch MNSW may then be clamped at a voltage higher than the terminal of the lowest terminal voltage of signal switch MNSW.

Bootstrapped switch circuit 1 shown in FIGS. 1 and 2 may allow switch operation of signal switch MNSW from rail-to-rail (e.g., from $V_{SS}$ to $V_{DD}$) while limiting all gate-source and gate-drain voltages to rail voltage $V_{DD}$, thus minimizing oxide overstress.

However, despite its advantages, bootstrapped switch circuit 1 may fail to function if input signal $v_{in}$ rises above rail voltage $V_{DD}$. This is because with the bulk of transistor MP6 biased to rail voltage $V_{DD}$, the drain-bulk diode voltage of transistor MP6 may be forward-biased. Identically, with the gate terminal of transistor MP6 biased to rail voltage $V_{DD}$ during bootstrap phase ϕ$_2$, transistor MP6 may be turned on and short the input to rail voltage $V_{DD}$.

SUMMARY

In accordance with the teachings of the present disclosure, the disadvantages and problems associated with existing approaches for bootstrapped switching may be reduced or eliminated.

In accordance with embodiments of the present disclosure, a bootstrapped switch circuit may include a signal switch configured to, when enabled via a gate terminal of the signal switch during a sampling phase of the bootstrapped switch circuit, pass an input signal received at its input to its output. The bootstrapped switch circuit may also include a bootstrap circuit coupled to the signal switch comprising a bootstrap capacitor and a plurality of switches coupled to the bootstrap capacitor, wherein one of the plurality of switches comprises a p-type field effect transistor configured to decouple, by deactivating a second p-type field effect transistor, the bootstrap capacitor during a bootstrap phase of the bootstrapped switch circuit in which the signal switch is disabled, and further wherein the p-type field effect transistor is coupled to other of the plurality of switches and the bootstrap capacitor such that the signal switch is able to pass the input signal having a magnitude greater than voltage supply rails of the bootstrapped switch circuit from the input to the output.

In accordance with these and other embodiments of the present disclosure, a method may include passing, by a signal switch when enabled via a gate terminal of the signal switch during a sampling phase of the bootstrapped switch circuit, an input signal received at its input to its output. The method may also include decoupling, by a p-type field effect transistor of a plurality switches of a bootstrap circuit coupled to the signal switch and comprising a bootstrap capacitor and the plurality of switches coupled to the bootstrap capacitor, and by deactivating a second p-type field effect transistor, the bootstrap capacitor during a bootstrap phase of the bootstrapped switch circuit in which the signal switch is disabled; wherein the p-type field effect transistor is coupled to other of the plurality of switches and the bootstrap capacitor such that the signal switch is able to pass the input signal having a magnitude greater than voltage supply rails of the bootstrapped switch circuit from the input to the output.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
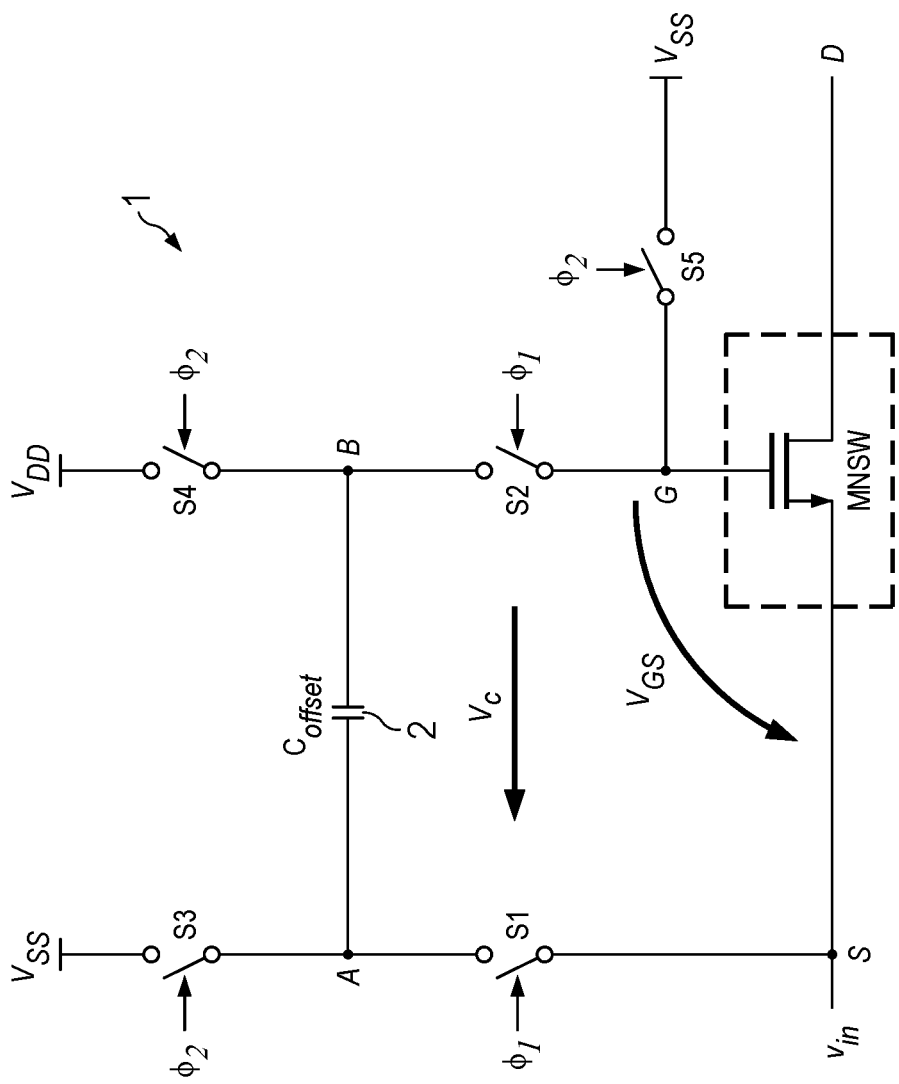
FIG. 1 illustrates a circuit diagram of an example bootstrapped switch circuit, as is known in the art.
Figure 2:
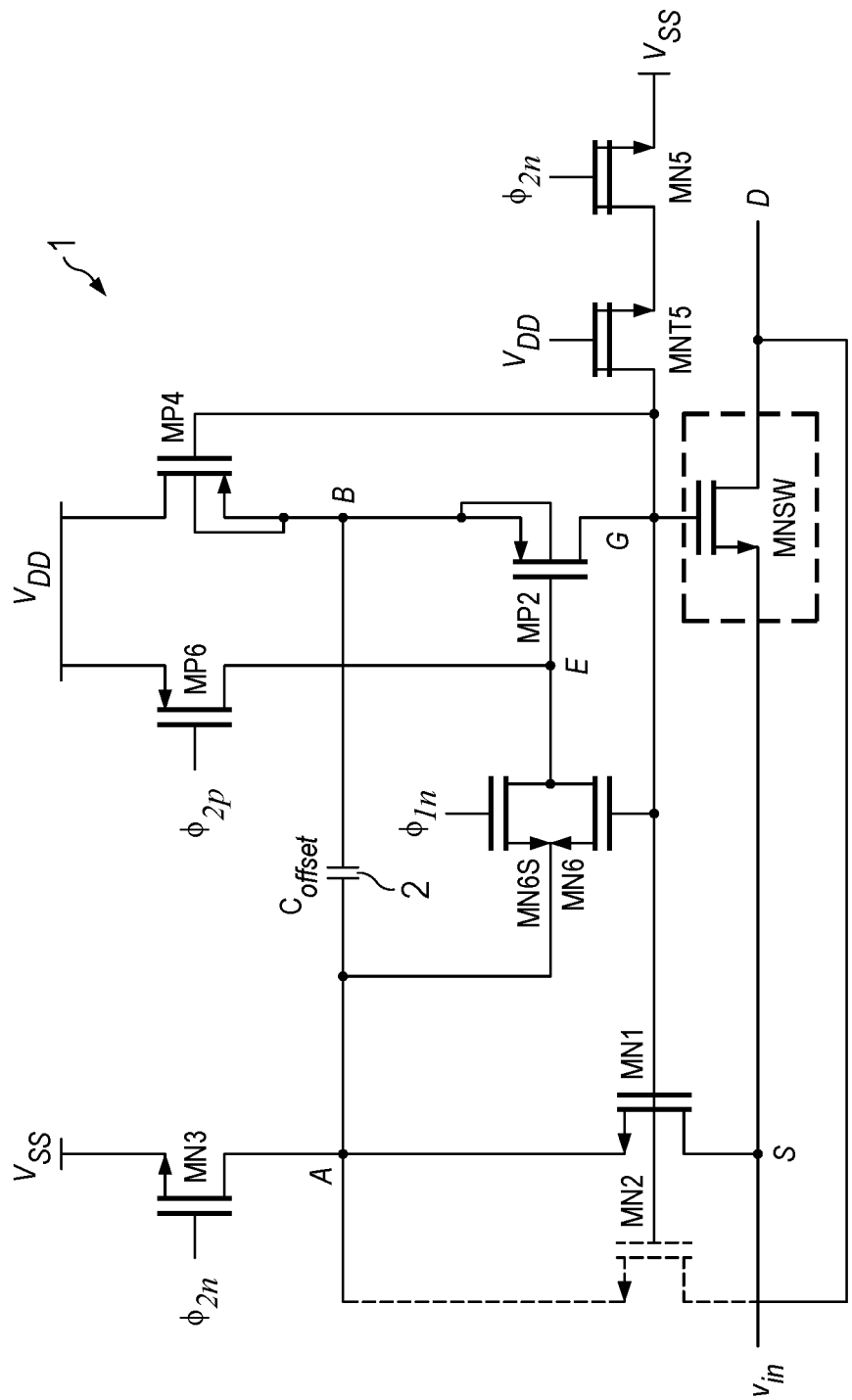
FIG. 2 illustrates a circuit diagram of an example transistor-level implementation of the bootstrapped switch circuit shown in FIG. 1, as is known in the art.
Figure 3:
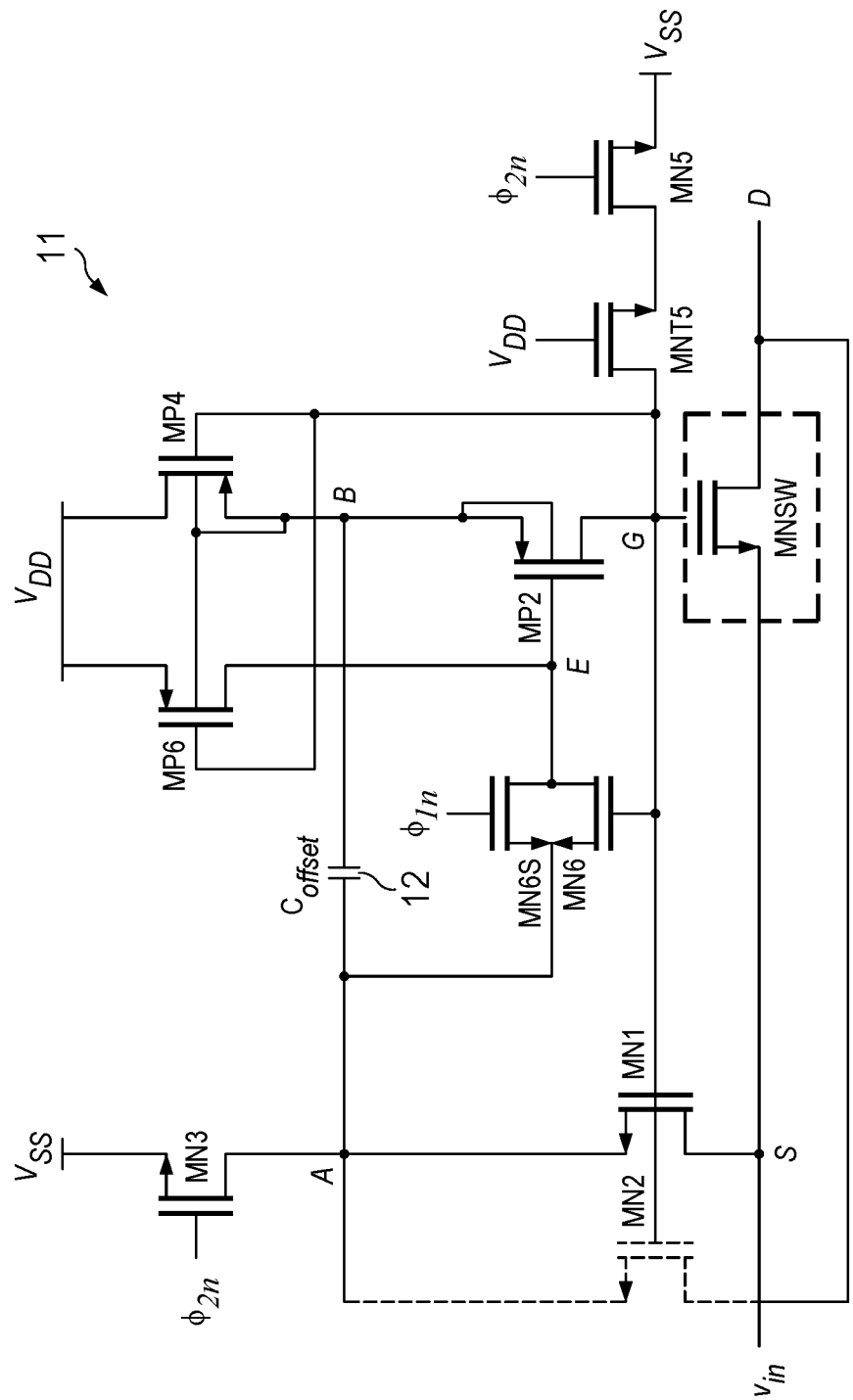
FIG. 3 illustrates a circuit diagram of an example transistor-level implementation of a bootstrapped switch circuit, in accordance with embodiments of the present disclosure.

FIG. 3 illustrates a circuit diagram of an example transistor-level implementation of a bootstrapped switch circuit 11, in accordance with embodiments of the present disclosure. As shown in FIG. 3, bootstrapped switch circuit 11 may include a signal switch MNSW, which may be implemented as an n-type field-effect transistor, and may be configured to, during a sampling phase $\phi_1$, sample an input signal $v_{in}$ present at a source terminal of signal switch MNSW onto a drain terminal of signal switch MNSW, which may in turn be coupled to a delta-sigma modulator, ADC, and/or other electronic circuit. Bootstrapped switch circuit 11 may also include a bootstrap circuit comprising field-effect transistors MN1, MP2, MN2, MN3, MP4, MN5, MNT5, MN6, MN6S, and MP6 and a bootstrap capacitor 12 having a capacitance $C_{offset}$. Bootstrapped switch circuit 11 may be similar in many respects to bootstrapped switch circuit 1 described in the Background section, and thus, only differences between bootstrapped switch circuit 11 and bootstrapped switch circuit 1 may be described below.

In particular, a main difference between bootstrapped switch circuit 11 and bootstrapped switch circuit 1 is the connectivity of p-type field-effect transistor MP6 relative to other components of bootstrapped switch circuit 11. For example, the bulk of transistor MP6 may be coupled to node B, the node of bootstrapped switch circuit 11 that may have the highest voltage potential, such that the bulk of transistor MP6 is coupled to a terminal of bootstrap capacitor 12. Further, the gate terminal of transistor MP6 may be coupled to the gate terminal of signal switch MNSW. As a result, bootstrapped switch circuit 11 may enable a "beyond the rails" bootstrapped switch for highly linear sampling of input signals $v_{in}$ higher in magnitude than the supply rails $V_{DD}$ and $V_{SS}$.

In addition, bootstrapped switch circuit 11 may enable over-voltage protection, as a p-type field-effect transistor (e.g., transistor MP6) configured for decoupling bootstrap capacitor 12 from the gate terminal of signal switch MSNW during bootstrap phase $\phi_2$ (e.g., when signal switch MSNW is off) by turning off (e.g., disabling, opening, deactivating) p-type transistor MP2, and may have its gate terminal protected from over-voltage by a bootstrapped clock signal also received by the gate terminal of signal switch MSNW, for example during sampling phase $\phi_1$. Further, a p-type field-effect transistor (e.g., transistor MP6) configured for biasing bootstrap capacitor 12 during bootstrap phase $\phi_2$ (e.g., when signal switch MSNW is off) may have its bulk protected from over-voltage by a voltage present at a terminal of the bootstrap capacitor, wherein such voltage present at such terminal of the bootstrap capacitor 12 may be the highest voltage potential present in bootstrapped switch circuit 11 in all relevant operational states of bootstrapped switch circuit 11.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A bootstrapped switch circuit comprising:
    a signal switch configured to, when enabled via a gate terminal of the signal switch during a sampling phase of the bootstrapped switch circuit, pass an input signal received at its input to its output; and
    a bootstrap circuit coupled to the signal switch comprising a bootstrap capacitor and a plurality of switches coupled to the bootstrap capacitor, wherein one of the plurality of switches comprises a p-type field effect transistor configured to decouple, by deactivating a second p-type field effect transistor, the bootstrap capacitor during a bootstrap phase of the bootstrapped switch circuit in which the signal switch is disabled, and further wherein the p-type field effect transistor is coupled to other of the plurality of switches and the bootstrap capacitor such that the signal switch is able to pass the input signal having a magnitude greater than voltage supply rails of the bootstrapped switch circuit from the input to the output, further wherein the p-type field effect transistor is coupled at a first non-gate terminal to a voltage rail of the bootstrapped switch circuit throughout the sampling phase and the bootstrap phase, and further wherein a bulk of the p-type field effect transistor is electrically isolated from both non-gate terminals of the p-type field effect transistor.

2. The bootstrapped switch circuit of claim 1, further wherein:
    during the sampling phase, a gate terminal of the p-type field effect transistor is protected from over-voltage by a bootstrapped clock signal received at the gate terminal of the signal switch; and
    a bulk of the p-type field effect transistor is protected from over-voltage by a voltage present at a terminal of the bootstrap capacitor.

3. The bootstrapped switch circuit of claim 2, wherein such voltage present at such terminal of the bootstrap capacitor is the highest voltage potential present in the bootstrapped switch circuit during both the sampling phase and the bootstrap phase.

4. The bootstrapped switch circuit of claim 1, wherein the p-type field effect transistor is coupled at its gate terminal to the gate terminal of the signal switch.

5. The bootstrapped switch circuit of claim 1, wherein the p-type field effect transistor is coupled at its bulk to a terminal of the bootstrap capacitor.

6. The bootstrapped switch circuit of claim 5, wherein the p-type field effect transistor is coupled at a second non-gate terminal to a gate of the second p-type field effect transistor, wherein the second p-type field effect transistor is coupled at its non-gate terminals between the terminal of the bootstrap capacitor and the gate of the signal switch.

7. A method comprising:
    passing, by a signal switch when enabled via a gate terminal of the signal switch during a sampling phase of a bootstrapped switch circuit, an input signal received at its input to its output; and
    decoupling, by a p-type field effect transistor of a plurality switches of a bootstrap circuit coupled to the signal switch and comprising a bootstrap capacitor and the plurality of switches coupled to the bootstrap capacitor, and by deactivating a second p-type field effect transistor, the bootstrap capacitor during a bootstrap phase of the bootstrapped switch circuit in which the signal switch is disabled; wherein the p-type field effect transistor is coupled to other of the plurality of switches and the bootstrap capacitor such that the signal switch is able to pass the input signal having a magnitude greater than voltage supply rails of the bootstrapped switch circuit from the input to the output, further wherein the p-type field effect transistor is coupled at a first non-gate terminal to a voltage rail of the bootstrapped switch circuit throughout the sampling phase and the bootstrap phase, and further wherein a bulk of the p-type field effect transistor is electrically isolated from both non-gate terminals of the p-type field effect transistor.

8. The method of claim 7, further comprising:
    protecting, during the sampling phase, a gate terminal of the p-type field effect transistor from over-voltage by a bootstrapped clock signal received at the gate terminal of the signal switch; and
    protecting a bulk of the p-type field effect transistor from over-voltage by a voltage present at a terminal of the bootstrap capacitor.

9. The method of claim 8, wherein such voltage present at such terminal of the bootstrap capacitor is the highest voltage potential present in the bootstrapped switch circuit during both the sampling phase and the bootstrap phase.

10. The method of claim 7, wherein the p-type field effect transistor is coupled at its gate terminal to the gate terminal of the signal switch.

11. The method of claim 7, wherein the p-type field effect transistor is coupled at its bulk to a terminal of the bootstrap capacitor.

12. The method of claim 11, wherein the p-type field effect transistor is coupled at a second non-gate terminal to a gate of the second p-type field effect transistor, wherein the second p-type field effect transistor is coupled at its non-gate terminals between the terminal of the bootstrap capacitor and the gate of the signal switch.

* * * * *